(12) United States Patent
Guevara et al.

(10) Patent No.: US 11,637,083 B2
(45) Date of Patent: Apr. 25, 2023

(54) FLIP-CHIP PACKAGE ASSEMBLY

(71) Applicant: Texas Instruments Incorporated, Dallas, TX (US)

(72) Inventors: Rafael Jose Lizares Guevara, Metro Manila (PH); John Carlo Cruz Molina, Bataan (PH); Steffany Ann Lacierda Moreno, Tarlac (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/219,453

(22) Filed: Mar. 31, 2021

(65) Prior Publication Data

US 2022/0320038 A1 Oct. 6, 2022

(51) Int. Cl.
*H01L 23/48* (2006.01)
*H01L 23/00* (2006.01)
*H01L 21/48* (2006.01)

(52) U.S. Cl.
CPC .......... *H01L 24/81* (2013.01); *H01L 21/4828* (2013.01); *H01L 24/13* (2013.01); *H01L 24/16* (2013.01); *H01L 24/96* (2013.01); *H01L 24/97* (2013.01); *H01L 2224/13019* (2013.01); *H01L 2224/13144* (2013.01); *H01L 2224/13147* (2013.01); *H01L 2224/16258* (2013.01); *H01L 2224/81024* (2013.01); *H01L 2224/81192* (2013.01); *H01L 2224/81815* (2013.01); *H01L 2924/17747* (2013.01)

(58) Field of Classification Search
None
See application file for complete search history.

(56) References Cited

U.S. PATENT DOCUMENTS

| | | | |
|---|---|---|---|
| 6,484,927 B1 * | 11/2002 | Adriance | B23K 31/02 228/248.1 |
| 7,262,082 B1 * | 8/2007 | Lin | H01L 24/82 438/109 |
| 2009/0130838 A1 * | 5/2009 | Sakaguchi | H01L 24/81 438/613 |
| 2018/0374780 A1 * | 12/2018 | Mazzola | H01L 21/4828 |

\* cited by examiner

*Primary Examiner* — Hung K Vu
(74) *Attorney, Agent, or Firm* — Dawn Jos; Frank D. Cimino

(57) ABSTRACT

In a described example, a method includes: forming cavities in a die mount surface of a package substrate, the cavities extending into the die mount surface of the package substrate at locations corresponding to post connects on a semiconductor die to be flip-chip mounted to the package substrate; placing flux in the cavities; placing solder balls on the flux; and performing a thermal reflow process and melting the solder balls to form solder pads in the cavities on the package substrate.

18 Claims, 10 Drawing Sheets

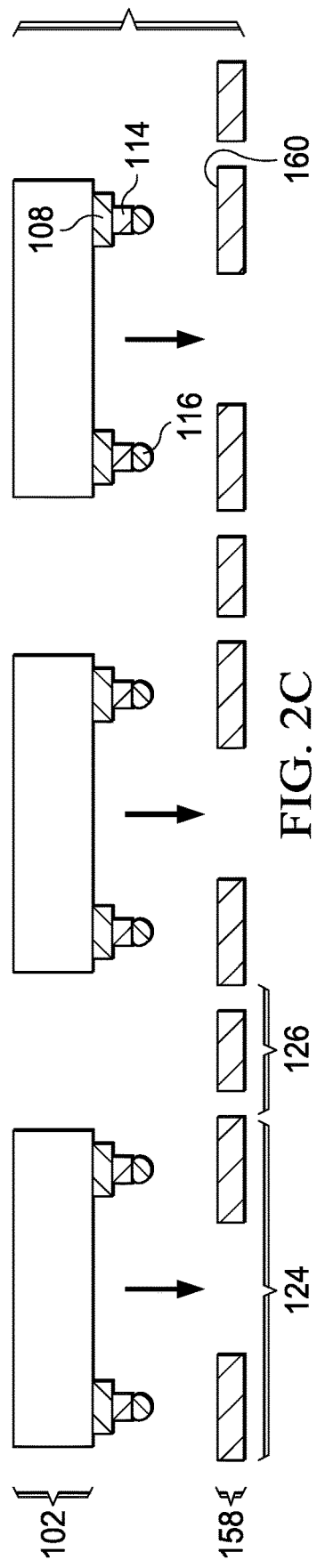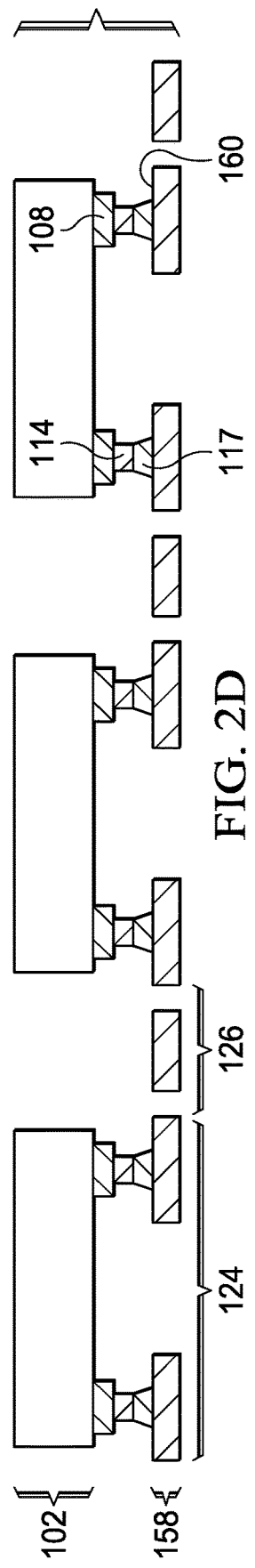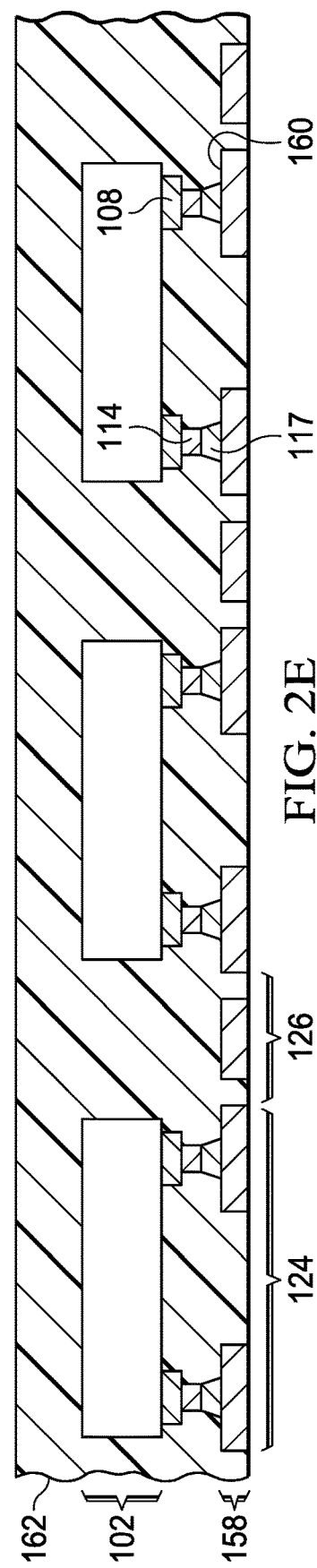

FIG. 6A
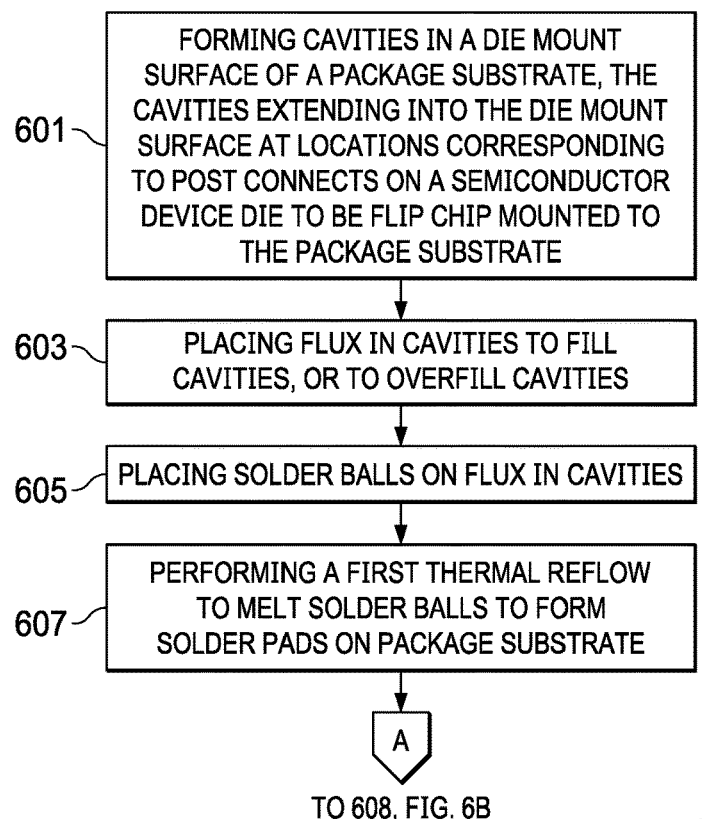
TO 608, FIG. 6B
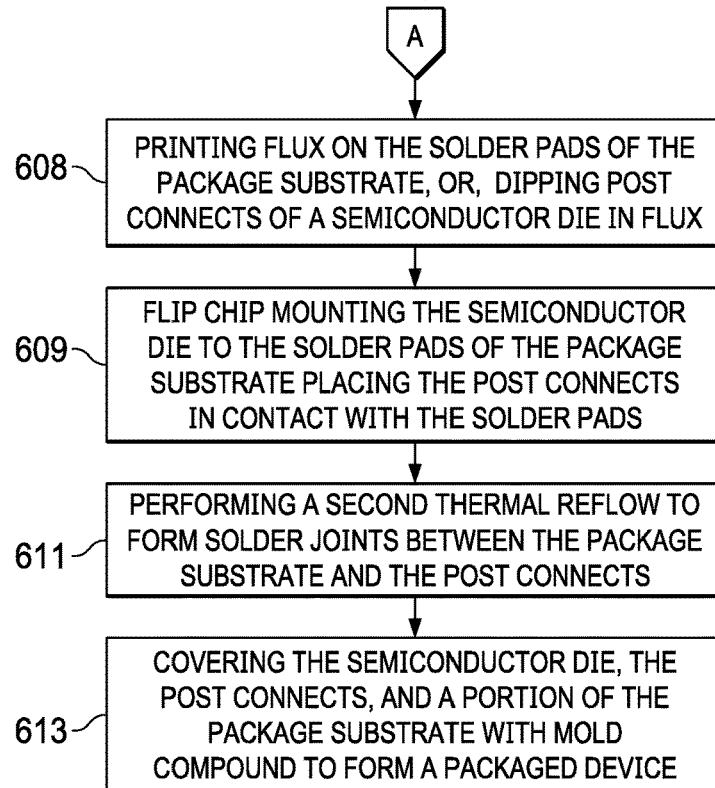
FIG. 6B

FLIP-CHIP PACKAGE ASSEMBLY

TECHNICAL FIELD

This relates generally to packaging electronic devices, and more particularly to assembling flip chip packaged semiconductor devices.

BACKGROUND

Processes for producing packaged semiconductor devices include mounting the electronic devices to a package substrate, and then covering the electronic devices with a mold compound in a molding process to form packages. When devices are mounted on package substrates in flip-chip packages, a semiconductor die has conductive post connects that extend from a proximal end placed on bond pads on an active surface of the semiconductor die to a distal end having a solder ball or solder bump. In a flip-chip package the semiconductor die is mounted with the active surface facing the package substrate. When the semiconductor die is flip-chip mounted to the package substrate, the solder bumps at the distal end of the post connects are subjected to a thermal reflow process so that the solder melts and flows to form solder joints. The solder joints mechanically attach and electrically couple the semiconductor die to the package substrate. The solder joints attach the conductive post connects to conductive areas on the package substrate.

As the size and number of connections increase, and as semiconductor dies decrease in size, the pitch distance between the conductive post connects decreases. In some example flip-chip packaging processes, shorts between solder joints due to solder bridging can occur, for example when a solder bump is misaligned on a package substrate as the devices are assembled. When solder balls are placed on the ends of the conductive post connects, balls can be missing or misaligned. When these defects are detected at a manual or at an automated visual inspection test, completed and functional semiconductor dies are scrapped. When solder balls are misaligned or are non-uniform in a flip chip assembly, dies can tilt during die mount, causing additional defects, additional scrap and increasing costs. A flip-chip package assembly method with reliable solder joints at tighter pitch and using smaller dies and increasingly smaller post connects is needed.

SUMMARY

In a described example, a method includes: forming cavities in a die mount surface of a package substrate, the cavities extending into the die mount surface of the package substrate at locations corresponding to post connects on a semiconductor die to be flip-chip mounted to the package substrate; placing flux in the cavities; placing solder balls on the flux; and performing a thermal reflow process and melting the solder balls to form solder pads on the die mount surface of the package substrate. In a further example, the method continues by mounting a semiconductor die onto the solder pads, the semiconductor die having post connects extending from a bond pad at a proximal end to a distal end, the distal end contacting the solder pads; forming solder joints by performing another thermal reflow to melt the solder in the solder pads, the solder joints attaching the post connects to the package substrate; and covering the semiconductor die, the post connects, the solder pads, and a portion of the package substrate with mold compound to form a flip chip packaged semiconductor device.

BRIEF DESCRIPTION OF THE DRAWINGS

FIGS. 2A-2F illustrate in projection views and cross-sectional views major steps in manufacturing a flip-chip packaged electronic device.

FIGS. 6A-6B illustrate in flow diagrams steps of method arrangements.

DETAILED DESCRIPTION

Figure 1:
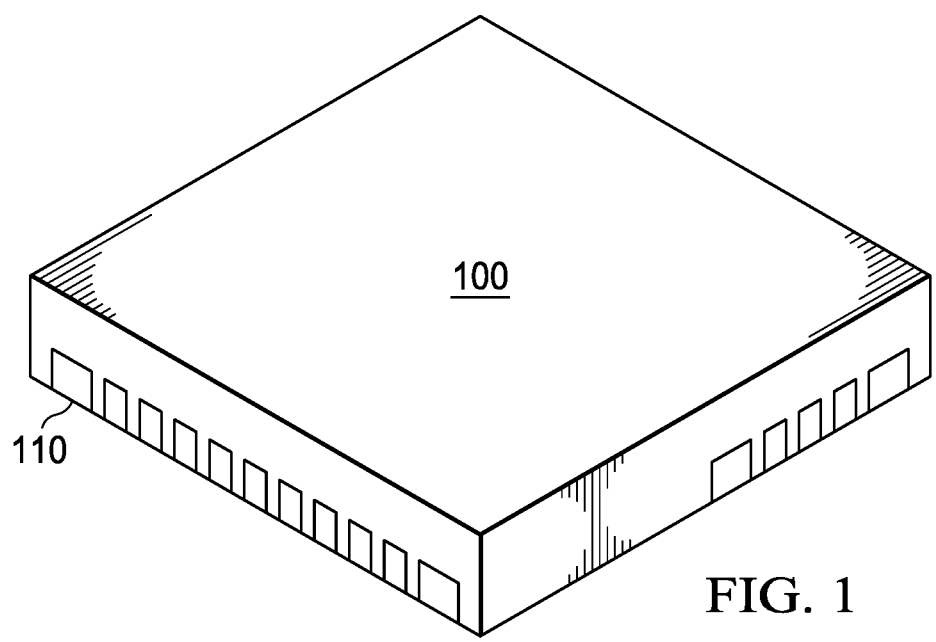
FIG. 1 is a projection view of a flip chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be flip-chip mounted with the active surface facing a package substrate surface, and the semiconductor die mounted to the leads of the package substrate by conductive post connects attached to the package substrate by solder such as solder balls or bumps. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. For flip-chip packages, a portion of the leads are configured to receive solder joints between the leads and the conductive post connects for the semiconductor die. The solder joints form the physical die attach and the electrical connection to the package substrate. When lead frames are used as package substrates, the lead frames can be provided in strips or arrays. Dies can be placed on the strips or arrays, the dies flip-chip mounted to the lead frames and the lead frames and dies then covered with mold compound in a molding process.

Alternative package substrates include pre-molded lead frames (PMLF) and molded interconnect substrates (MIS) for receiving semiconductor dies. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrate can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as FR4 can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximal end of the post connect is mounted to a bond pad on the active surface of a semiconductor die, while a distal end of the post connect is extended away from the bond pad of the semiconductor die. When the packaged semiconductor device is oriented with the semiconductor die positioned above and facing a die mount surface of a package substrate in a flip-chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and has a distal end facing away from the surface of the bond pad on the semiconductor die, where a proximal end of the post connect is mounted to the bond pad. Some of the post connects described herein have a "dished" feature. Dishing at the distal ends of plated post connects is observed due to aspects of the plating processes used to form the post connects. A "dished" feature is a recessed or slightly concave area in a center portion of the distal end of a plated post connect. In some of the arrangements, the dished feature advantageously engages with a solder pad on a package substrate, however, in other arrangements, a post connect without a dished feature can be used.

A package substrate, such as a lead frame, MIS, or PMLF substrate, has conductive portions on a planar die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that the post connect appears as a rail or has a rectangular cross section. When the post connect is copper and is pillar shaped and has solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. A thermal reflow process is used to melt solder between the post connect and the package substrate to make a solder joint. The solder joint provides both a mechanical attachment and an electrical connection between the semiconductor die and the package substrate. Post connects are used to form several, tens, hundreds or thousands of connections between a semiconductor die and a package substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Post connects can vary in size and shape, but in examples range from 10-70 microns in diameter, and may range from 20-50 microns in height extending away from the bond pad surface on the semiconductor die. As device sizes continue to fall and the density of connections rises, these sizes may decrease. Spacing between post connects may also decrease.

In packaging semiconductor devices, a mold compound may be used to partially cover a package substrate, to cover the semiconductor die, and to cover the connections from the semiconductor die to the package substrate. This "encapsulation" process is often an injection molding process, where thermoset mold compound such as epoxy resin can be used. A room temperature solid or powder mold compound can be heated to a liquid state and then molding can be performed. Transfer molding can be used. Unit molds shaped to surround an individual device may be used, or block molding may be used, to form the packages simultaneously for several devices using molten mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In flip-chip die attach processes, solder balls, solder columns, or solder bumps are used to form solder joints between the conductive post connects and a conductive lead or land on a package substrate. The post connects are formed extending from bond pads of the semiconductor die. The semiconductor die is then oriented with the distal ends of the post connects facing a die mounting surface of a circuit board or package substrate. A solder reflow process is used to attach the post connects to conductive die pads or leads on the package substrate, the solder joints forming a physical attachment and an electrical connection between the package substrate and the semiconductor die.

In the arrangements described herein, solder pads are formed on the package substrate at locations where the post connects will be mounted to the package substrate, and the post connects do not carry the solder. The package substrate can be referred to as a "pre-wetted" package substrate. In contrast, in prior approaches solder bumps are formed at the end of the post connects. These solder bumps can be difficult to align on the package substrate, can become lost or misaligned during assembly, and when misaligned can cause shorts between post connects in the packaged device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

In the arrangements, a package substrate has cavities formed in correspondence with at least some of the post connects on a semiconductor die. Flux is deposited in the cavities. In a precision drop operation solder balls are placed on the flux. A first thermal reflow process is used to melt the solder balls and form solder pads on the package substrate. In the arrangements, the solder pads can have a rounded upper surface due to surface tension effects in the molten solder while the solder undergoes the thermal reflow. A second flux can be deposited on the solder pads.

A semiconductor die has conductive post connects with distal ends for meeting the solder pads on the package substrate. In some examples the post connects are formed by plating and have a dished feature at the distal end that meets the solder pads on the package substrate, which can have a rounded upper surface. To attach the semiconductor die to the package substrate, the post connects and the solder pads are brought into contact after flux is deposited on either the end of the post connects, or, on the solder pads. The solder pads can have a curved top that meets and engages with the distal end of the post connect. A second thermal reflow process forms a solder joint between the post connect and the package substrate, the cavities in the surface of the package substrate containing the solder in the correct positions and preventing solder bridging during reflow. Mold compound is formed over the semiconductor die and covering the die mount surface of the package substrate, and surrounding the post connects and the solder joints. The resulting solder joints are uniform and reliable, with a reduction or elimination of solder outside the solder joints, eliminating or reducing shorts between solder joints.

FIG. 1 illustrates a packaged electronic device 100 in a quad flat no lead (QFN) package. The packaged electronic device can be a body formed from a thermoset mold compound, such as epoxy resin. Other mold compounds, such as resins, epoxies, or plastics can be used. Leads 110 are part of a package substrate that supports a semiconductor die (not visible in FIG. 1, as it is obscured by the package body) within the package, the leads 110 are exposed from the mold compound and form electrical terminals for the packaged electronic device. The packaged electronic device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller. The number of terminals 110 is increasing with additional integration of circuitry on semiconductor dies.

Figure 2B:
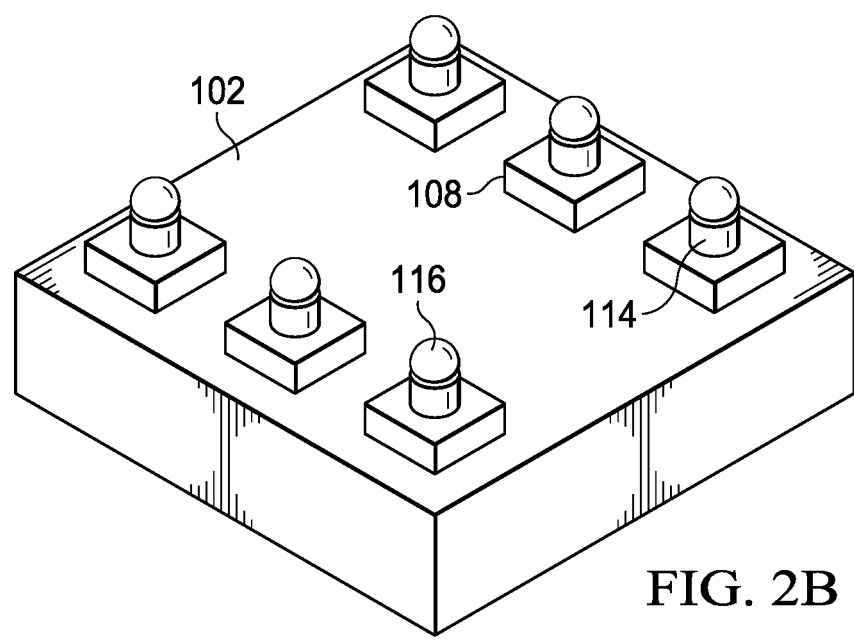
Figure 2A:
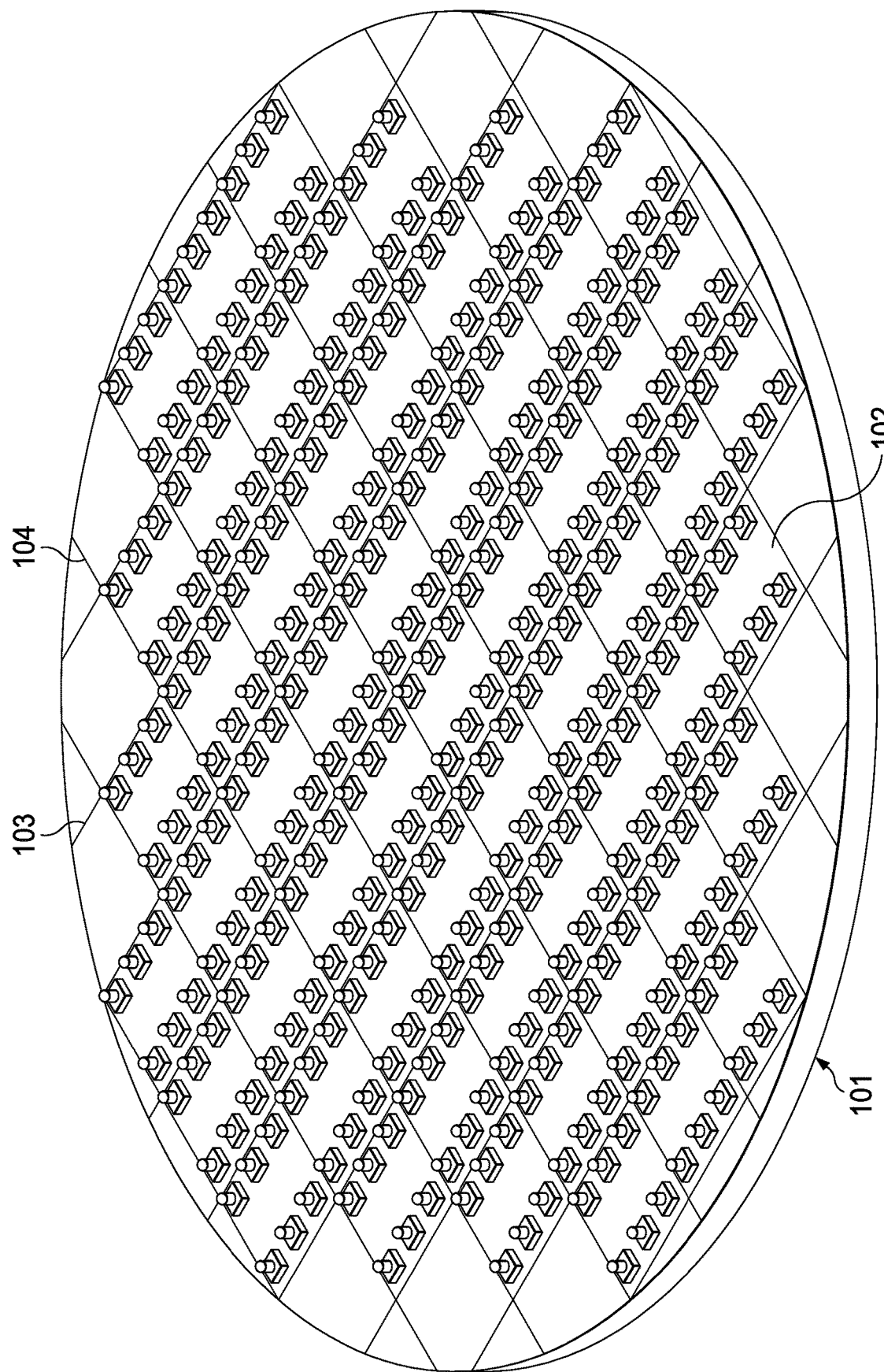

FIGS. 2A-2F illustrate in a series of steps a method for forming flip-chip packaged electronic devices using solder bumps on conductive post connects. In FIG. 2A, a semiconductor wafer 101 is shown with an array of semiconductor dies 102 in rows and columns formed on an active surface. The semiconductor dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the wafer is oriented in FIG. 2A) scribe lines 103 and 104, which are perpendicular to one another and which run in parallel groups across the wafer, separate the rows and columns of the completed semiconductor dies, and provide areas for dicing the wafer to separate the semiconductor dies 102 from one another.

FIG. 2B illustrates a single semiconductor die 102, with bond pads 108, which are conductive pads that are electrically coupled to devices formed in the semiconductor die 102. Conductive post connects 114 are shown extending away from a proximate end mounted on the bond pads 108 on the active surface of semiconductor die 102, and solder bumps 116 are formed on the distal ends of the conductive post connects 114. The conductive post connects can be formed by electroless or electroplating. In an example, the conductive post connects are copper pillar bumps. Copper pillar bumps can be formed by sputtering a seed layer over the surface of the semiconductor wafer 101, forming a photoresist layer over the seed layer, using photolithography to expose the bond pads 108 in openings in the layer of photoresist, plating the copper conducive post connects 114 on the bond pads, and plating a lead solder or a lead-free solder such as an tin, silver (SnAg) or tin, silver, copper (SnAgCu) ("SAC") solder to form solder bumps 116 on the copper conductive post connects 114. Other conductive materials can be used for the conductive post connects in an electroplating or electroless plating operation, including silver (Ag), nickel, palladium, nickel palladium, tin, for example. Not shown for clarity of illustration are under bump metallization (UBM) which can be formed over the bond pads to improve plating and adhesion between the conductive post connects and the bond pads 108. After the plating operations, the photoresist is then stripped, and the excess seed layer is etched from the surface of the wafer. The semiconductor dies are then separated by dicing, or are singulated, using the scribe lines 103, 104 (see FIG. 2A).

FIG. 2C shows in a cross sectional view semiconductor dies 102 after the semiconductor dies 102 have been singulated from the semiconductor wafer 101 with bond pads 108, post connects 114 and solder bumps 116. Solder bumps 116 can be shaped in a thermal reflow process of columnar plated solder to form solder bumps. The semiconductor dies 102 are flip-chip oriented, facing a die mounting surface of a package substrate 158. In the illustrated example, the package substrate 158 is a conductive lead frame. Each unit lead frame 124 in a strip or array is spaced from an adjacent unit lead frame by a saw street 126. The lead frames have a conductive surface and may include plated areas (not shown) to receive the solder bumps, or the solder bumps may be soldered directly to the lead frame surface in designated positions. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used at the solder joint positions.

In FIG. 2D, a cross sectional view shows the singulated dies 102 after mounting on the die pads 160 on the conductive lead frame by solder joints 117 formed using solder bumps 116 (see FIG. 2C) on the conductive post connects 114. A thermal reflow process may be used to melt the solder bumps 116 and form the solder joints between the post connects 114 and the package substrate 158. The solder joints 117 provide both mechanical attachment and electrical connection between the semiconductor die 102 and the package substrate 158.

FIG. 2E is another cross sectional view that shows the semiconductor dies 102 with bond pads 108, conductive post connects 114 and solder joints 117 after an encapsulation molding process covers the semiconductor devices and portions of the package substrate 158 with a mold compound 162. The semiconductor dies 102, the solder joints 117, the conductive post connects 114, and portions of the package substrate 158 are shown covered with a mold compound 162. The mold compound 162 may be a filled resin epoxy. The mold compound 162 can be subjected to a thermal cure or can be a thermoset mold compound, heated to liquefy it, and dispensed in a transfer mold as a heated liquid that cures and solidifies as it cools. Other mold compounds and materials such as plastics, resins, or epoxies can be used. Saw streets 126 separate the molded devices from each other between unit lead frames 124.

Figure 2F:
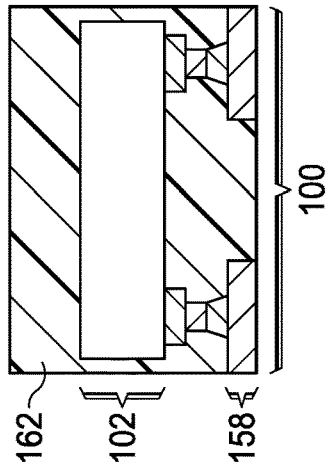

In FIG. 2F, a cross sectional view shows individual packaged semiconductor dies 100 after the devices have been singulated one from one another by cutting through the saw streets 126 on the package substrate 158. Each packaged semiconductor device 100 has a package body of mold compound 162, leads 110 that are partially covered by the mold compound 162 and with portions exposed from the mold compound 162 to form terminals for the packaged semiconductor device.

When mounting the conductive post connects and solder bumps to a package substrate using the flip-chip assembly of FIGS. 2A-2F, misalignment of the solder bumps to conductive leads or conducive traces on the package substrate can occur. Solder bumps can be non-uniform in size or thickness, which can lead to die tilt in packaged devices. Solder bumps can be lost or become misaligned during assembly and prior to solder reflow, resulting in shorts between post connects in the packaged devices. The arrangements described herein address these problems.

Figure 3B:
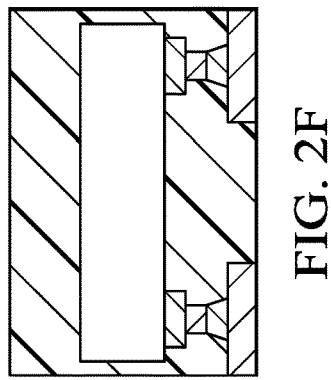
FIGS. 3A-3B illustrate in cross-sectional views details of post connects that can be used with the arrangements.
Figure 3B:
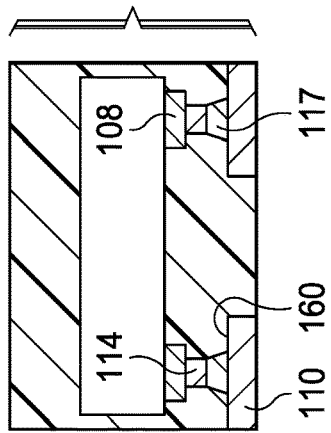
Figure 3B:
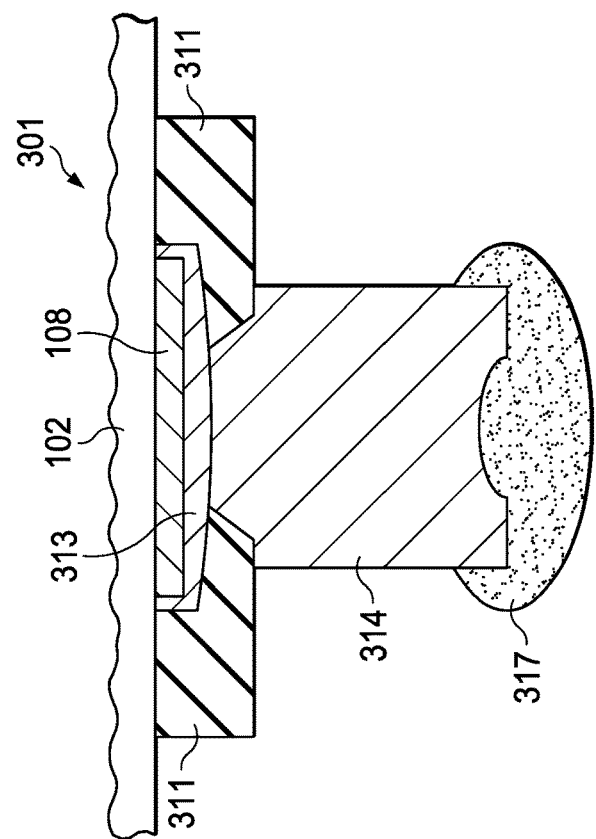
Figure 3A:
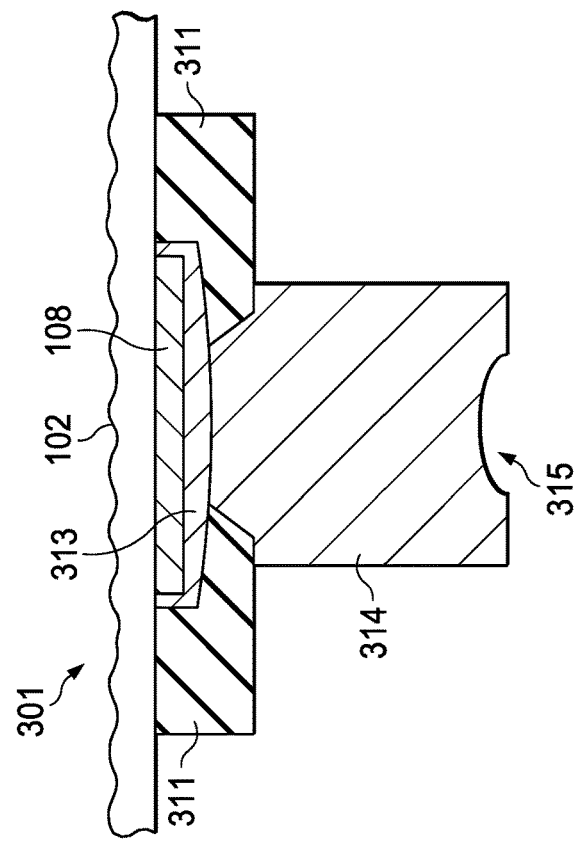

FIGS. 3A-3B illustrate, in cross-sectional views, details of conductive post connects that can be used in example arrangements. In FIG. 3A, semiconductor substrate 102 has a bond pad 108 on a surface. Aluminum and copper bond pads can be used, increasingly semiconductor processes use copper for metallization in manufacturing semiconductor devices and for bond pads. Passivation dielectric materials 311, which can be of several layers, are formed over the surface of the substrate and surrounding the bond pad 108, and partially overlying the bond pad 108. An underbump metallization (UBM) 313 is formed on the bond pad 108. UBM materials are chosen to form diffusion barriers, increase adhesion and improve the reliability of the conductive post connects, and to provide a low resistance electrical path between the bond pad 108 and the post connects. The passivation layer 311 is opened to expose the surface of the bond pad and the UBM. To form the post connect 314, a plating process can be used. A seed layer for plating can be deposited by sputtering, for example, and then patterned over the UBM 313. Electroless or electroplating can be used to deposit a layer of the metal for the post connect 314 on the seed layer, The post connect can be gold, copper, or combinations or alloys of these, The post connect material will plate onto the exposed seed layer, and thus form posts, rails, or columns depending on the seed layer pattern. In an example where the post connects are copper and are columns or are oval shapes in cross section, the post connects are sometimes referred to as "copper pillars". However, gold and other materials can be used. An inherent "dished" feature typically forms when plating the post connects due to dishing during plating, forming a dished feature 315, where the center portion of the distal end of the post connects has an indentation or convex feature. In the arrangements, this dished feature 315 will be engage the post connect 314 with a solder pad on a package substrate, to improve alignment and to ensure a reliable solder joint forms. The post connect 314 has a proximal end that is attached to the semiconductor substrate 102 at the bond pad 108, and a distal end that extends away from the semiconductor substrate 102, and which has the dished feature 315. The distal end of post connect 314 will be used for mounting the semiconductor die 102 to a package substrate.

FIG. 3B illustrates in a cross sectional view an alternative arrangement for the post connect 314. In FIG. 3B, the distal end of the post connect 314 is completed as in FIG. 3A, and is then dipped in a flux to place a flux coating 317 on the distal end of the post connect 314. The flux can be a "no-clean" flux used in semiconductor packaging, to save the need for a clean step later. Alternatives include rosin based and water soluble fluxes. In the arrangements, as is further described below, flux may be printed onto the package substrate the post connect will be mounted to, in those arrangements the post connect 314 will not need to be dipped in flux, as in FIG. 3A. In alternative arrangements, the flux will be carried to the package substrate solder pads by the post connects. In these arrangement, the post connects will be dipped in flux, as in FIG. 3B, and will provide the flux for the solder joints to be formed.

In the arrangements as shown in FIGS. 3A-3B, in contrast to the pillar bump processes used in prior flip-chip approaches, the conductive post connect 314 is not bumped with solder using a ball, or a solder paste, at the end of the post connect. The solder in the arrangements is instead formed on a lead or a conductive land of a package substrate, prior to mounting the semiconductor die 102 to the package substrate. When the semiconductor die is flip-chip mounted to the package substrate, the use of the pre-wetted package substrate ensures the solder is placed correctly and thus improves the solder joints that result. The alignment and uniformity of the solder joints in the packaged devices is improved by the arrangements, and shorts between solder joints for the post connects are reduced or eliminated.

Figure 4A:
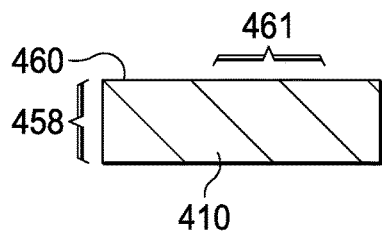
FIGS. 4A-4B, 4C, 4CC, 4D, 4DD, 4E, 4EE, 4F and 4FF illustrate in a series of cross-sectional views steps in forming a package substrate and an alternative package substrate for use with the arrangements.
Figure 4B:
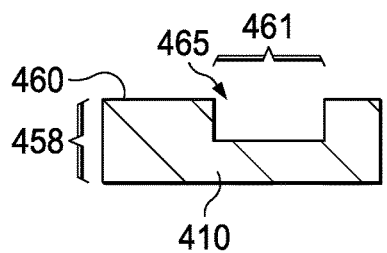
Figure 4C:
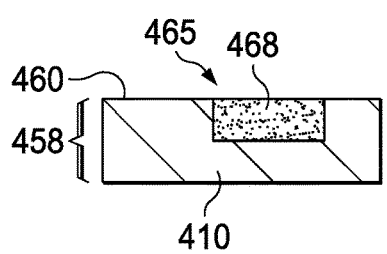
Figure 4C:
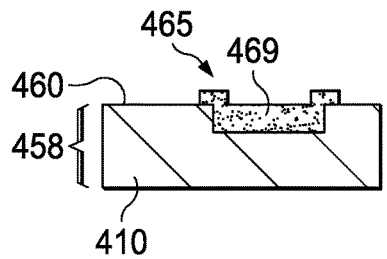

FIGS. 4A-4CB 4C, 4CC, 4D, 4DD, 4E, 4EE, 4F and 4FF, are a series of cross sections illustrating selected steps for forming a package substrate for use in the arrangements. FIG. 4A illustrates leads 410 of a package substrate 458. In this example the package substrate 458 is a conductive leadframe, for example a copper leadframe. The copper leadframe may be plated with layers of materials to prevent tarnish, reduce copper ion diffusion, and increase solderability (not shown for simplicity of illustration). Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold). In FIG. 4A, areas 461, 463 are positions on the leads 410 configured to receive a corresponding post connect for a flip-chip mounted semiconductor die. The die mount surface 460 of package substrate 458 is a planar surface for mounting the semiconductor die.

In FIG. 4B, the package substrate of FIG. 4A is shown in another cross section after cavities 465, 467 are formed in the die mount surface 460. The cavities are 465, 467 formed in areas 461, 463 which correspond to positions of post connects on a semiconductor die to be mounted to the package substrate 458. The cavities 465, 467 can be formed by laser ablation of the metal lead frame. In alternative approaches, the cavities can be formed using etching or stamping operations. The cavities are only a few microns in depth. The cavities can extend into the package substrate up to 50% of the substrate thickness. The laser ablation also removes oxides from the surface 460 of the package substrate 458, preparing it for solder processing. Although FIG. 4B shows only two cavities, cavities such as 465, 467 are formed for each of the post connects on a semiconductor die that is to be flip-chip mounted to the package substrate, there may be several, tens, hundreds, or thousands of post connects in a particular application, depending on the number of inputs/outputs for the die.

FIG. 4C illustrates in a cross section the package substrate 458 after additional processing. In FIG. 4C, in an example pattern, flux 468 is shown disposed within the cavities 465, 467. The flux 468 is used to prevent oxides from interfering with the solder processing and to improve and control solder wetting. Flux 468 can be deposited using a stencil, for example, or another deposition process. In the pattern of FIG. 4C, the flux 468 is placed in "1:1" correspondence with the cavities 465, 467, the flux 468 is disposed within the cavities and has an exposed surface coplanar with the die mount surface 460.

FIG. 4CC illustrates in a cross section an alternative flux pattern for an example arrangement. When the flux 469 is deposited, it is allowed to overfill the cavities 465, 467. In FIG. 4CC, flux 469 is shown filling the cavities and extending onto the die mount surface 460 of package substrate 458, in this alternative the flux 469 lies over the die mount surface 460 around the cavities 465, 467.

Figure 4D:
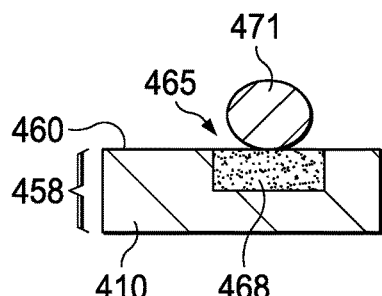
Figure 4D:
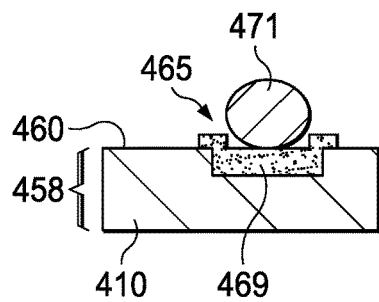
Figure 4D:
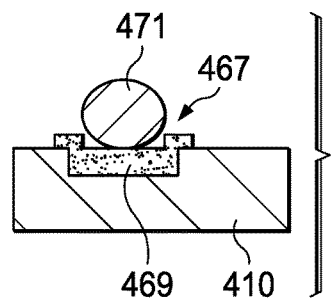

FIG. 4D illustrates in a cross section the package substrate 458 using the flux 468 of FIG. 4C after additional processing. Solder balls 471 are placed on the flux 468 at each cavity 465, 467. The solder balls 471 can be lead based or lead free solder balls, in an example arrangement SnAgCu ("SAC") solder balls are used. Other lead free or lead based solder balls can be used. "Micro" balls useful in the arrangements and can have diameters as low as 40 microns, and solder balls ranging from 40 microns to 100 microns can be used. For an oval or rectangular cross section post connect, such as an oval or rail shape, multiple solder balls can be placed on the flux in the cavity, so that arbitrary post connect shapes can be accommodated in the arrangements. The amount of solder disposed on the package substrate is determined by the post connect diameters and shapes. Smaller balls can be used with multiple solder balls at each cavity, or larger balls can be used with a single ball at each cavity.

FIG. 4DD illustrates in a cross section solder balls 471 placed on flux pattern 469 for the alternative flux pattern arrangement of FIG. 4CC. The flux 469 extends out of the cavities 465, 467 and onto the die mount surface 460 of the package substrate 458 around the cavities, while the solder balls 471 are centered in the cavity areas.

Figure 4E:
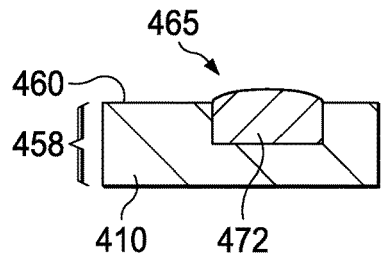
Figure 4E:
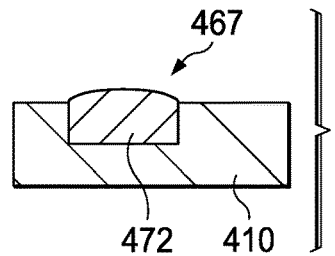
Figure 4E:
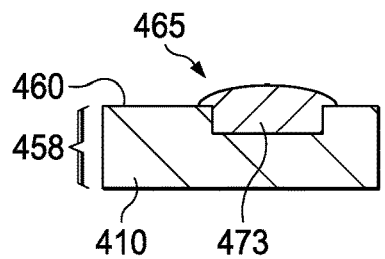
Figure 4E:
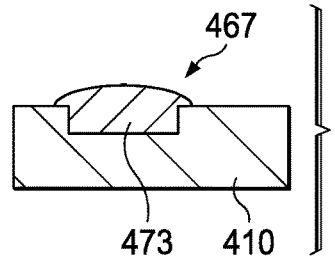

FIG. 4E illustrates in a cross section solder pads 472 that are formed when the solder balls (see 471 in FIG. 4D) are subjected to a first thermal reflow process. The solder balls are brought to a temperature above a melting temperature.

The solder balls melt, wetting to the flux in the cavities, and then solidify to form the solder pads with the rounded upper surface in the cavities 465, 467. The rounded upper surface forms due to surface tension effects when the solder is in molten form, and the rounded upper surface of the solder pads can be used to meet the dished feature in the plated post connects of certain example semiconductor devices when the devices are assembled, alternatively post connects without the dished feature can also be attached to the solder pads.

FIG. 4EE illustrates in a cross section solder pads 473 that form when the solder balls 471 in FIG. 4DD are subjected to a thermal reflow. The solder balls melt and wetted by the flux (469 in FIG. 4DD) that is in and around the cavities 465, 467, and the solder forms the solder pads 473 that extend outside the cavities and onto the die mount surface 460 of the package substrate 458. The solder pads 473 also have a rounded upper surface.

Figure 4F:
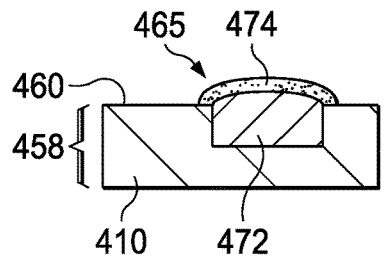
Figure 4F:
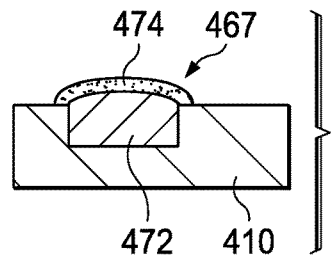
Figure 4F:
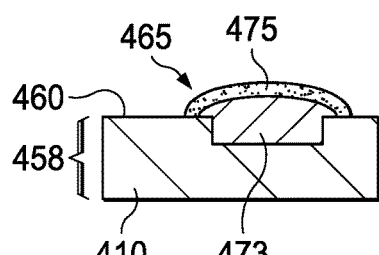
Figure 4F:
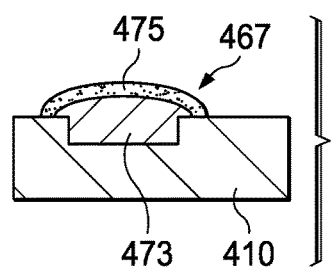

FIG. 4F illustrates in a cross section the solder pads of FIG. 4E after a flux deposition step. In an arrangement where the flux for the solder joints is to be provided by the package substrate, the post connects on the semiconductor die will not carry flux, see FIG. 3A above for example, and the package substrate 458 will be printed with flux 474 over the solder pads 472 as shown in FIG. 4F. In an arrangement where the post connects are dipped in flux, see FIG. 3B above, the package substrate is not required to have the flux on the solder pads, and will be ready at the step shown in FIG. 4E. FIG. 4F illustrates flux printing on the package substrate, while FIG. 3B illustrates flux dipping on the post connects, at least one of these steps is needed to prepare for forming a solder joint between the post connects and the solder pads.

FIG. 4FF is a cross section illustrating the solder pads 473 of FIG. 4EE when a flux 475 is printed using a screen printing process to cover the solder pads. When the post connects are dipped in flux, the package substrate is ready for mounting the semiconductor die at the stage shown in FIG. 4EE. When the post connects on the semiconductor die will not carry flux, the flux printing shown in FIG. 4FF is needed.

FIG. 4E (or alternatively, FIG. 4F) and FIG. 4EE (or alternatively, FIG. 4FF) illustrate alternative arrangements for a package substrate that is ready for a flip-chip mounting operation. The package substrates can be formed independently of the semiconductor dies and can provided as pre-wetted package substrate components for a device packaging operation. The flux printing step can be used for arrangements where the post connects of the semiconductor die are not carrying flux such as in FIG. 3A, or can be omitted in an arrangement where the post connects are dipped in flux, such as in FIG. 3B. The flux used can be a no-clean flux, to save a clean step later. Alternatively, the flux can be a rosin based or water soluble flux such as those used in semiconductor device packaging.

Figure 5A:
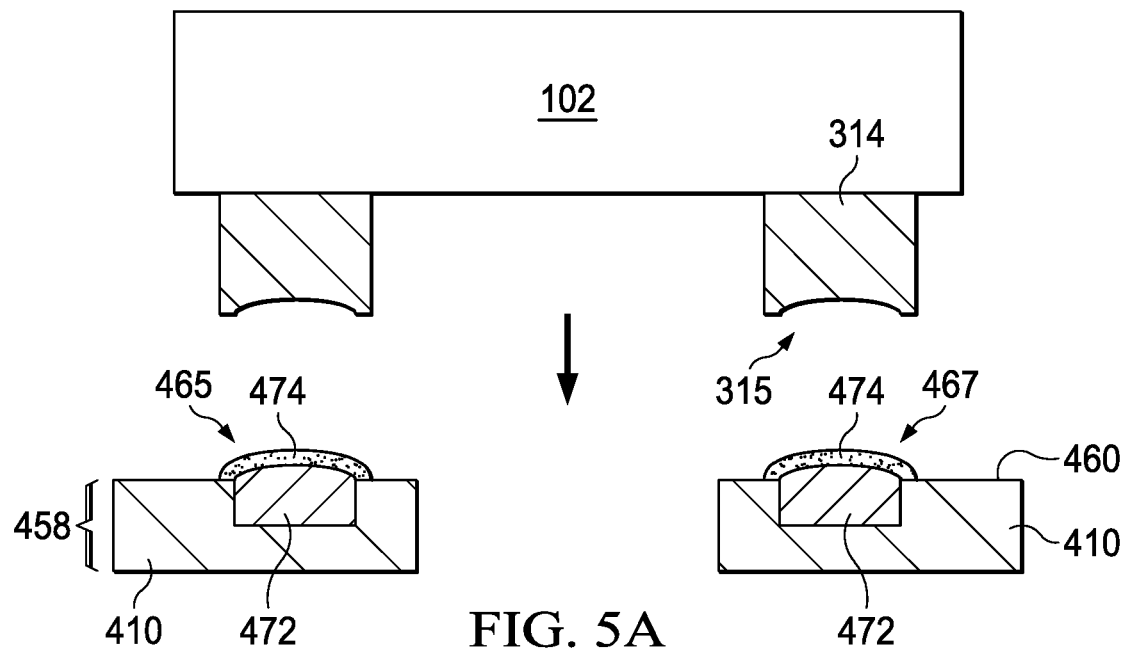
FIGS. 5A, 5AA, 5B, 5BB, 5C and 5CC, illustrate in a series of cross sectional views, a method for forming a flip-chip semiconductor packaged device in an arrangement and in an alternative arrangement.
Figure 5A:
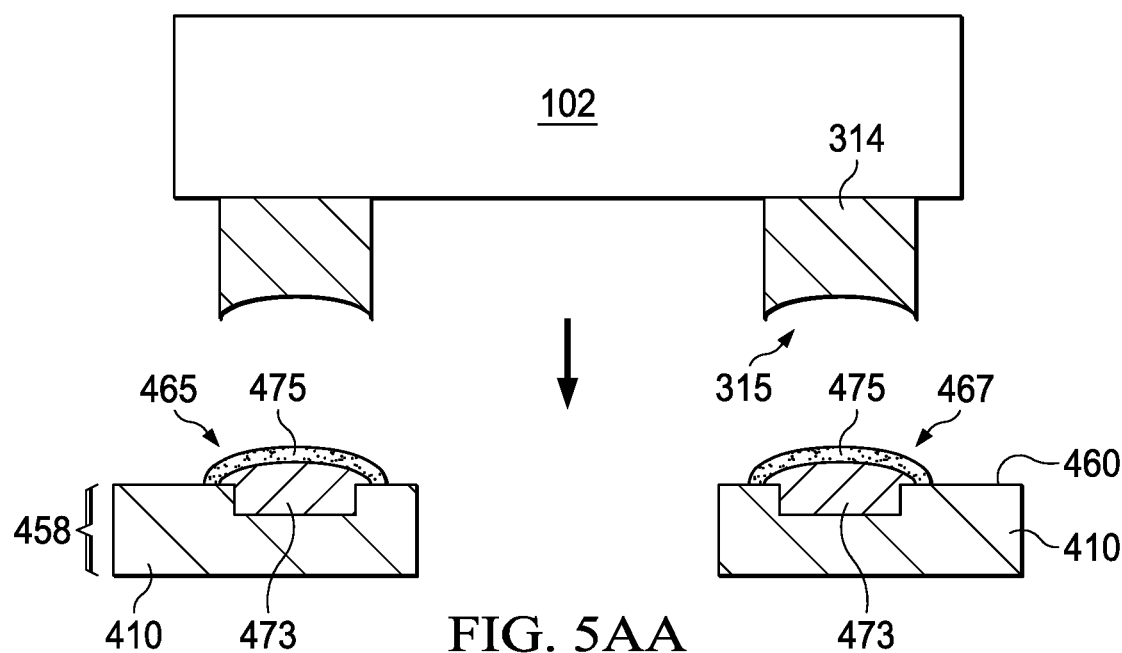

FIGS. 5A, 5AA, 5B, 5BB, 5C, and 5CC illustrate in cross sectional views selected steps for forming a packaged electronic device using the arrangements. In FIGS. 5A, 5AA, 5B, 5BB, 5C and 5CC, the package substrate solder pads are shown with the flux printed on the solder pads. In alternatives where the post connects are dipped in flux prior to flip-chip mounting, the package substrate will not need the flux printed on the solder pads, although it could be included in any case. FIG. 5A illustrates a package substrate 458 with solder pads 472 within cavities 465, 467 that is positioned under and aligned with a semiconductor die 102. Flux 474 is shown printed on the solder pads 472. Semiconductor device die 102 has post connects 314 and in this example the post connects include dish features 315 at the distal ends of the post connects 314. FIG. 5AA similarly illustrates, in another cross section, a semiconductor die 102 positioned over and aligned with a package substrate 458 with solder pads 473 and flux 475 in cavities 465, 467 and in the alternative arrangement, the solder pads 173 overlie portions of the die mount surface 460.

Figure 5B:
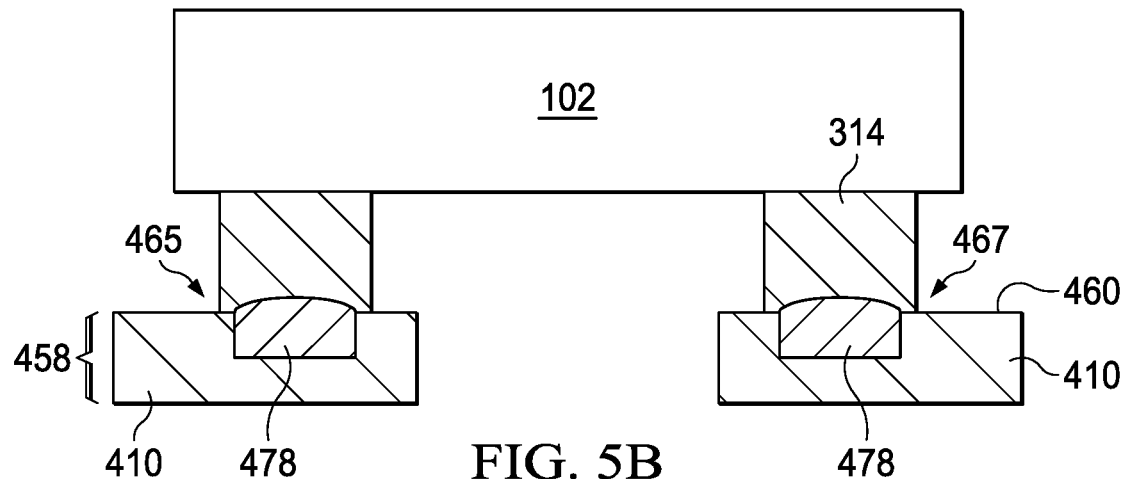
Figure 5B:
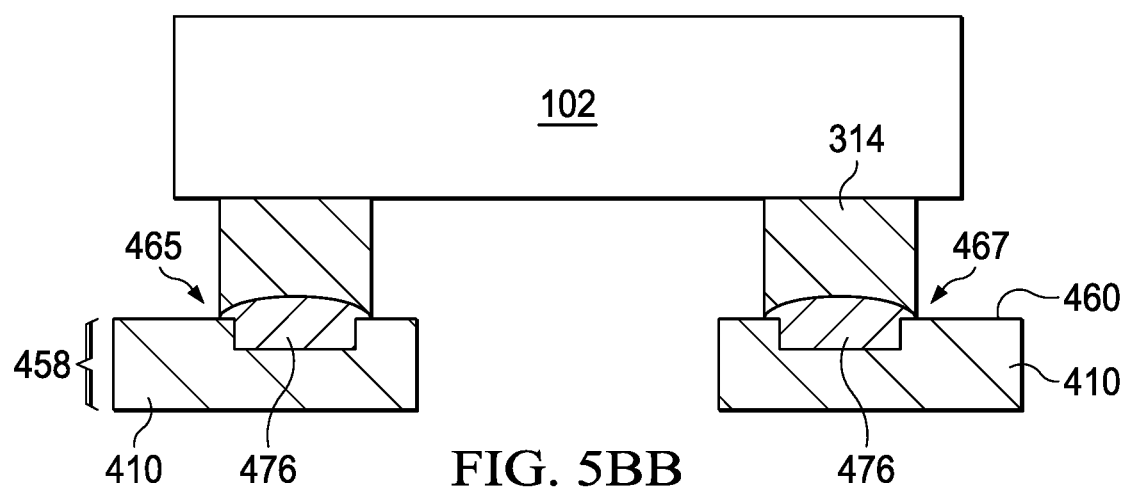

FIG. 5B illustrates in another cross sectional view the semiconductor die 102 and package substrate 458 of FIG. 5A after additional processing. In FIG. 5B, the semiconductor die 102 is brought into contact with and mounted to the die mount surface 460 of package substrate 458. The post connects 314 are coupled to and attached to the package substrate by solder joints 478 formed by another thermal reflow process on solder pads 472 (see FIG. 5A). The solder joints 478 form with the dish features 315 of the post connects, meeting the curved top of solder pads 472, to ensure good alignment and robust solder joints. FIG. 5BB similarly illustrates in a cross section the semiconductor die 102 mounted to package substrate 458 after the solder pads 473 (see FIG. 5AA) are further processed in another solder reflow process to form solder joints 476, with the solder joints 476 extending outside the cavities 465, 467 and overlying the die mount surface 460 on package substrate 458.

Figure 5C:
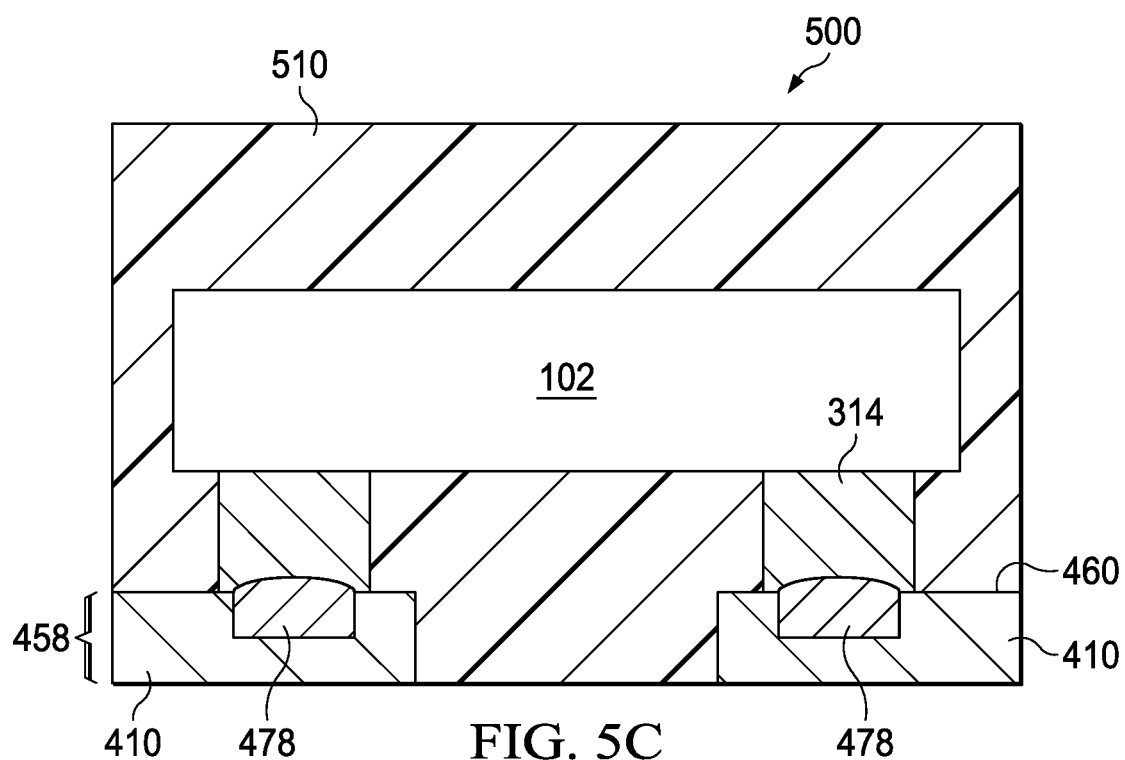
Figure 5C:
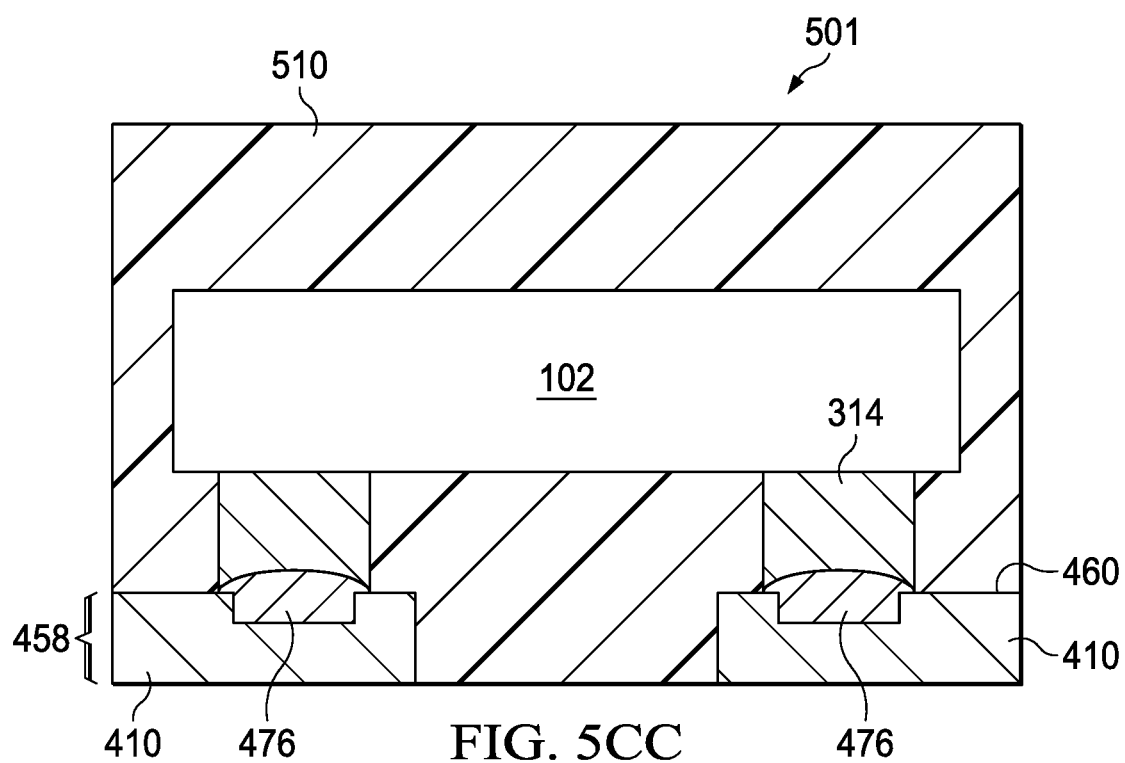

FIG. 5C illustrates, in a cross sectional view, an example completed semiconductor device package 500 following additional processing on the elements shown in FIG. 5B. The semiconductor device package 500 has a body formed from mold compound 510, which covers the semiconductor die 102, the post connects 314, the solder joints 478, and a portion of the package substrate 458, while a portion of leads 410 remain exposed from the mold compound 510 and form terminals for the device package 500. The mold compound 510 can be formed in an encapsulation process by use of a thermoset epoxy resin mold compound that is supplied as a solid, heated to liquid state, and then allowed to flow in a mold chase to cover the devices, then cooled and cured to form a solid body. Other molding processes can be used. Alternatives include epoxy, resin, plastic and other dielectric materials.

Similar to FIG. 5C, FIG. 5CC illustrates in a cross section a packaged semiconductor device 501 that results from additional processing on the elements of FIG. 5BB. Mold compound is used to cover the semiconductor die 102, the post connects 314, the solder joints, and portions of the package substrate 458. The leads 410 have portions exposed from the mold compound to form terminals of the packaged device. The mold compound forms the package body. The mold compound can be applied to an array or strip of flip-chip devices on package substrates in an encapsulation process such as block molding, or in a transfer chase for unit molding, and the molded devices are separated in a sawing or laser cutting operation.

FIGS. 6A-6B are flow diagrams that illustrate method arrangements. At step 601 in FIG. 6A, cavities are formed in a die mount surface of a package substrate at positions corresponding to post connect positions on a semiconductor die to be mounted on the package substrate. The package substrate can be a metal leadframe, such as a copper leadframe. Laser ablation can be used to form the cavities. Etch or stamp operations can be used. The cavities are sized to receive solder balls for use in forming solder joints to conductive post connects. In some example arrangements, the cavities can be configured to receive multiple solder balls.

At step 603, a stencil operation or other dispensing method is used to place flux in the cavities. In some arrangements the flux may fill the cavities and be coplanar with the planar die mount surface of the package substrate in a "1:1" flux arrangement. In an alternative method, the flux may overfill the cavities and may extend onto the planar die mount surface of the package substrate around the cavities slightly, to provide additional area for solder.

At step 605, solder balls are placed onto the flux in the cavities in a precision drop operation. A stencil can be used to precisely place the solder balls. In some examples, for oval, rail or rectangular shaped post connects, multiple solder balls may be placed on flux in a cavity to provide sufficient solder volume.

At step 607, the package substrate is subjected to a first thermal reflow process to form solder pads on the package substrate. The steps of FIG. 6A form a packaged substrate that is pre-wetted with solder for use in a flip-chip assembly process. These steps can be performed independently with, or in conjunction with the steps of FIG. 6B.

In FIG. 6B, step 608 can follow the step 607 in FIG. 6B. At step 608, flux is printed on the solder pads of the package substrate, or, alternatively, post connects of a semiconductor die to be mounted to the package substrate are dipped in flux. At step 609, the semiconductor die having post connects is flip-chip mounted on the solder pads of the package substrate, the ends of the post connects contact the solder pads. In an example, the solder pads have a curved surface that meets dished features at the ends of the post connects, to provide additional alignment and improve the resulting solder joints. At step 611, a second thermal reflow process again melts the solder pads on the package substrate, forming the solder joints. At step 613, the semiconductor die, the post connects, and a portion of the package substrate are covered with mold compound to form a packaged device.

The steps of FIG. 6A and of FIG. 6B may be done independently, or may be done in series as shown. A pre-wetted package substrate can be formed in the process of FIG. 6A at one location, and the assembly of the flip-chip semiconductor package can be performed in another location and at another time. The pre-wetted package substrate can be a component provided for use at a flip-chip packaging assembly site.

Modifications are possible in the described arrangements, and other alternative arrangements are possible within the scope of the claims.

What is claimed is:

1. A method, comprising:
    forming cavities in a die mount surface of a package substrate, the cavities extending into the die mount surface of the package substrate;
    placing flux in the cavities;
    placing solder balls on the flux;
    performing a thermal reflow process and melting the solder balls to form solder pads in the cavities on the package substrate; and
    mounting a semiconductor die on the solder pads, the semiconductor die having a post connects extending from bond pads at a proximal end to a distal end, the distal ends of the post connects contacting the solder pads, the post connect including a concave recess at the distal end.

2. The method of claim 1, wherein the flux fills the cavities and has a surface coplanar with the die mount surface of the package substrate.

3. The method of claim 2, wherein the solder pads fill the cavities and are coextensive with the cavities.

4. The method of claim 3, wherein the solder pads have a rounded upper surface extending above the die mount surface of the package substrate.

5. The method of claim 4, wherein the solder pads fill the cavities and extend onto the die mount surface of the package substrate around the cavities.

6. The method of claim 5, wherein the solder pads have a rounded upper surface extending above the die mount surface of the package substrate.

7. The method of claim 1, wherein the flux fills the cavities and overfills the cavities, extending onto the die mount surface of the package substrate around the cavities.

8. The method of claim 1, wherein the package substrate is a copper lead frame.

9. The method of claim 1, wherein placing solder balls on the cavities further comprises placing multiple solder balls on the cavities.

10. The method of claim 1, wherein forming cavities further comprises performing laser ablation on the package substrate.

11. The method of claim 1, wherein the flux is a first flux, and further comprising depositing a second flux on the solder pads on the package substrate.

12. The method of claim 11, wherein the second flux is stencil printed on the solder pads on the package substrate.

13. The method of claim 11, wherein mounting the semiconductor die onto the solder pad includes mounting the semiconductor die onto the second flux on the solder pads, the method further comprising:
    forming solder joints by performing another thermal reflow to melt the solder in the solder pads, the solder joints attaching the post connects to the package substrate; and
    covering the semiconductor die, the post connects, the solder pads, and a portion of the package substrate with mold compound to form a flip-chip packaged semiconductor device.

14. The method of claim 13, wherein the post connects comprise one of copper and gold.

15. The method of claim 14, wherein the distal end of the post connects have a dished feature, and the solder pads of the package substrate have a curved surface that meets the dished feature of the post connects.

16. The method of claim 15 and further comprising flux formed on the distal end of the post connects, the flux on the distal ends of the post connects used with the solder pads on the package substrate to form the solder joints.

17. A method, comprising:
    forming cavities on a die mount surface of a copper lead frame by laser ablating leads of the copper lead frame, the cavities extending into the die mount surface of the leads;
    depositing a first flux in the cavities by a first stencil process;
    placing solder balls on the cavities by a second stencil process; and
    in a first thermal reflow process, melting the solder balls to form solder pads at the cavities to form pre-wetted solder pads at the cavities, the cavities having locations corresponding to the locations of post connects on a semiconductor die to be flip-chip mounted to the copper lead frame, the post connects being copper and having a proximal end on bond pads of the semiconductor die and extending to a distal end, the distal end including a concave recess;
    depositing a second flux on the pre-wetted solder pads;

mounting the post connects of the semiconductor die on the flux over the pre-wetted solder pads on the copper lead frame;

performing a second thermal reflow process to form solder joints between the leads of the copper lead frame and the distal end of the post connects; and covering the semiconductor die, post connects, the solder joints, and a portion of the copper lead frame in a mold compound to form a flip-chip packaged semiconductor device.

18. The method of claim 17, wherein at least one of the post connects of the semiconductor die is oval or rectangular in cross section, and wherein placing solder balls in the cavities further comprises placing multiple solder balls in a cavity.

* * * * *